United States Patent
Kwon et al.

(10) Patent No.: US 9,515,295 B2
(45) Date of Patent: Dec. 6, 2016

(54) LIGHT EXTRACTION SUBSTRATE FOR ORGANIC LIGHT EMITTING DEVICE, FABRICATION METHOD THEREFOR AND ORGANIC LIGHT EMITTING DEVICE INCLUDING SAME

(71) Applicant: Corning Precision Materials Co., Ltd., Chungcheongnam-do (KR)

(72) Inventors: Yoon Young Kwon, Chungcheongnam-do (KR); Joo Young Lee, Chungcheongnam-do (KR); Kyoung Wook Park, Chungcheongnam-do (KR); Jeong Woo Park, Chungcheongnam-do (KR); Eun Ho Choi, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/903,438

(22) PCT Filed: Jul. 8, 2014

(86) PCT No.: PCT/KR2014/006103
§ 371 (c)(1),
(2) Date: Jan. 7, 2016

(87) PCT Pub. No.: WO2015/005638
PCT Pub. Date: Jan. 15, 2015

(65) Prior Publication Data
US 2016/0164045 A1    Jun. 9, 2016

(30) Foreign Application Priority Data

Jul. 8, 2013 (KR) .................. 10-2013-0079486

(51) Int. Cl.
*H01L 21/00* (2006.01)
*H01L 51/56* (2006.01)
(Continued)

(52) U.S. Cl.
CPC .......... *H01L 51/56* (2013.01); *H01L 51/0096* (2013.01); *H01L 51/5268* (2013.01); *H01L 51/5275* (2013.01); *Y02E 10/549* (2013.01)

(58) Field of Classification Search
CPC ......... B42D 25/342; G02B 27/22; G02B 3/00; G02B 5/09; G02B 27/60
See application file for complete search history.

(56) References Cited

U.S. PATENT DOCUMENTS 9,052,096 B2 *  6/2015  Nishimura .......... H01L 51/5275
9,059,420 B2 *  6/2015  Sato ................... H01L 51/5275
(Continued)

FOREIGN PATENT DOCUMENTS

KR   10-2007-0110688 A   11/2007
KR   10-2010-0078354 A   7/2010
(Continued)

OTHER PUBLICATIONS

International Search Report for Application No. PCT/KR2014/006103 dated Aug. 25, 2014.

*Primary Examiner* — Caleb Henry
(74) *Attorney, Agent, or Firm* — Lerner, David, Littenberg, Krumholz & Mentlik, LLP

(57) ABSTRACT

The present invention relates to a light extraction substrate for an organic light emitting device, a fabrication method therefor and an organic light emitting device including the same and, more specifically, to a light extraction substrate for an organic light emitting device, a fabrication method therefor and an organic light emitting device including the same, wherein the light extraction substrate has aperiodic (Continued)

photonic crystal patterns formed on the front side thereof, through which light emitted from an organic light emitting element is emitted to the outside, thereby avoiding the dependency of light extraction on a specific wavelength band which occurs in existing periodic photonic crystal patterns, and inducing light extraction from a wider wavelength band. To this end, the present invention provides the light extraction substrate for the organic light emitting device, the fabrication method therefor and the organic light emitting device including the same, wherein the light extraction substrate, which is arranged on one surface through which the light emitted from the organic light emitting element is emitted to the outside, comprises: a base substrate; a matrix layer formed between the organic light emitting element and the base substrate; and the photonic crystal patterns formed on the base substrate, arranged inside the matrix layer and formed to have an aperiodic structure, wherein the matrix layer and the photonic crystal patterns form an internal light extraction layer of the organic light emitting device.

10 Claims, 5 Drawing Sheets

(51) Int. Cl.
*H01L 51/00* (2006.01)
*H01L 51/52* (2006.01)

(56) References Cited

U.S. PATENT DOCUMENTS

| | | | |
|---|---|---|---|
| 9,401,442 B2* | 7/2016 | Chaudhary | H01L 31/0236 |
| 2002/0030442 A1* | 3/2002 | Koyama | H01L 51/5262 |
| | | | 313/504 |
| 2003/0179364 A1* | 9/2003 | Steenblik | B82Y 20/00 |
| | | | 356/71 |
| 2004/0211971 A1* | 10/2004 | Takei | G02F 1/133603 |
| | | | 257/98 |
| 2005/0029538 A1* | 2/2005 | Choi | H01L 51/52 |
| | | | 257/103 |
| 2005/0153105 A1* | 7/2005 | Shimmo | C03C 17/3482 |
| | | | 428/172 |
| 2005/0205863 A1* | 9/2005 | Choi | B82Y 10/00 |
| | | | 257/40 |
| 2006/0081171 A1* | 4/2006 | Enokido | B82Y 20/00 |
| | | | 117/2 |
| 2007/0058260 A1* | 3/2007 | Steenblik | G02B 27/2214 |
| | | | 359/626 |
| 2007/0262330 A1 | 11/2007 | Lee et al. | |
| 2008/0037131 A1* | 2/2008 | Steenblik | B44F 1/10 |
| | | | 359/619 |
| 2008/0043795 A1* | 2/2008 | Hsueh | H01L 33/10 |
| | | | 372/45.01 |
| 2008/0237622 A1* | 10/2008 | Choi | H01L 33/382 |
| | | | 257/98 |
| 2008/0315236 A1* | 12/2008 | Lu | H01L 33/387 |
| | | | 257/98 |
| 2009/0101923 A1* | 4/2009 | Choi | H01L 33/20 |
| | | | 257/89 |
| 2009/0128004 A1* | 5/2009 | Chao | H01L 33/20 |
| | | | 313/498 |
| 2009/0162799 A1* | 6/2009 | Porque | G03B 27/52 |
| | | | 430/324 |
| 2009/0225805 A1* | 9/2009 | Nagatomo | B82Y 20/00 |
| | | | 372/99 |
| 2010/0052000 A1* | 3/2010 | Ko | H01L 33/382 |
| | | | 257/98 |
| 2010/0171094 A1* | 7/2010 | Lu | H01L 33/46 |
| | | | 257/13 |
| 2010/0270572 A1* | 10/2010 | Verschuuren | H01L 33/58 |
| | | | 257/98 |
| 2010/0282304 A1* | 11/2010 | Wu | H01L 25/167 |
| | | | 136/254 |
| 2011/0033156 A1* | 2/2011 | Sanghera | B29D 11/00682 |
| | | | 385/76 |
| 2011/0079805 A1* | 4/2011 | Yu | H01L 33/20 |
| | | | 257/98 |
| 2011/0095332 A1* | 4/2011 | Hwang | H01L 33/145 |
| | | | 257/103 |
| 2011/0164308 A1* | 7/2011 | Arsenault | G02F 1/15 |
| | | | 359/322 |
| 2011/0266577 A1 | 11/2011 | Kim et al. | |
| 2012/0032585 A1* | 2/2012 | Yamada | H01L 51/5275 |
| | | | 313/509 |
| 2012/0048368 A1* | 3/2012 | Chaudhary | B82Y 10/00 |
| | | | 136/256 |
| 2012/0104411 A1* | 5/2012 | Iza | H01L 31/02363 |
| | | | 257/76 |
| 2012/0125429 A1* | 5/2012 | Myong | G02B 1/005 |
| | | | 136/256 |
| 2012/0127406 A1* | 5/2012 | Geisow | G02F 1/13718 |
| | | | 349/113 |
| 2012/0261701 A1* | 10/2012 | Yoo | H01L 51/5275 |
| | | | 257/98 |
| 2012/0305966 A1 | 12/2012 | Shin | |
| 2013/0213464 A1* | 8/2013 | Kim | C23C 16/407 |
| | | | 136/256 |
| 2013/0299792 A1* | 11/2013 | Park | H01L 51/5268 |
| | | | 257/40 |
| 2014/0367957 A1* | 12/2014 | Jordan | G02B 3/0043 |
| | | | 283/85 |
| 2016/0101643 A1* | 4/2016 | Cape | G02B 3/0043 |
| | | | 359/627 |

FOREIGN PATENT DOCUMENTS

| | | |
|---|---|---|
| KR | 10-1000120 B1 | 12/2010 |
| KR | 10-2012-0133961 A | 12/2012 |

* cited by examiner

LIGHT EXTRACTION SUBSTRATE FOR ORGANIC LIGHT EMITTING DEVICE, FABRICATION METHOD THEREFOR AND ORGANIC LIGHT EMITTING DEVICE INCLUDING SAME

CROSS REFERENCE TO RELATED APPLICATIONS

The present application is a national phase entry under 35 U.S.C. §371 of International Application No. PCT/KR2014/006103, filed Jul. 8, 2014, which claims priority from Korean Application No. 10-2013-0079486, filed Jul. 8, 2013, all of which are incorporated herein by reference.

BACKGROUND OF THE INVENTION

Field of the Invention

The present invention relates to a light extraction substrate for an organic light-emitting device, a method of fabricating the same and an organic light-emitting device including the same, and more particularly, to a light extraction substrate for an organic light-emitting device which can overcome disadvantage of a conventional photonic crystal pattern having a periodic structure that light extraction is limited to a specific wavelength range and thereby cause light extraction in a wider wavelength range by disposing a photonic crystal pattern having a non-periodic structure at the front side of an organic light-emitting diode portion through which light from the organic light-emitting diode portion is emitted, a method of fabricating the same and an organic light-emitting device including the same.

Description of Related Art

In general, an organic light-emitting diode includes an anode, a light-emitting layer and a cathode. When a voltage is applied between the anode and the cathode, holes are injected from the anode into a hole injection layer and then migrate from the hole injection layer through a hole transport layer to the organic light-emitting layer, and electrons are injected from the cathode into an electron injection layer and then migrate from the electron injection layer through an electron transport layer to the light-emitting layer. Holes and electrons that are injected into the light-emitting layer recombine with each other in the light-emitting layer, thereby generating excitons. When such excitons transit from the excited state to the ground state, light is emitted.

Organic light-emitting devices including an organic light-emitting diode are divided into a passive matrix type and an active matrix type depending on the mechanism that drives an N*M number of pixels which are arranged in the shape of a matrix.

In an active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. The active matrix type organic light-emitting display consumes little power, and thus can be advantageously applied to high definition displays and large displays.

However, as shown in FIG. 7, only about 20% of light from an organic light-emitting diode portion is emitted to the outside and about 80% of the light is lost by a waveguide effect originating from the difference in the refractive index between a glass substrate 11 and the organic light-emitting diode portion which includes an anode 20, a hole injection layer and a hole transport layer 31, an emissive layer 32, and an electron transport layer and an electron injection layer 33 and by a total internal reflection originating from the difference in the refractive index between the glass substrate 11 and the air. Specifically, the refractive index of the internal organic light-emitting layer 30 ranges from 1.7 to 1.8, whereas the refractive index of indium tin oxide (ITO) which is generally used for the anode 20 ranges from 1.8 to 1.9. Since the two layers have a very small thickness ranging from 200 to 400 nm and the refractive index of glass used for the glass substrate 11 is about 1.5, a planar waveguide is thereby formed inside the organic light-emitting diode portion. It is calculated that the ratio of the light lost in the internal waveguide mode due to the above-described reason is about 45%. In addition, since the refractive index of the glass substrate 11 is about 1.5 and the refractive index of the ambient air is 1.0, when the light is directed outward from the inside of the glass substrate 11, a ray of the light having an angle of incidence greater than a critical angle is totally reflected and is trapped inside the glass substrate 11. Since the ratio of the trapped light is up to about 35%, only about 20% of the generated light is emitted to the outside.

In order to improve the luminous efficiency of the organic light-emitting device, a variety of conventional light extraction approaches was proposed. One of these light extraction approaches employs a photonic crystal structure that has a periodic pattern to extract light, the periodic pattern being formed at the front side of the organic light-emitting diode portion through which light from the organic light-emitting diode portion is emitted. A wavelength of extracted light depends on the size and period of the photonic crystal structure, and thus improvement in light extraction is limited to a specific wavelength range. The photonic crystal structure causes a phenomenon in which the intensity peak of one wavelength is higher than that of other wavelengths or the intensity peak is shifted. Accordingly, the conventional photonic crystal structure is not applicable to white organic light-emitting devices for lighting application, the uniform luminous intensity of which must be obtained in a wide wavelength range.

The information disclosed in the Background of the Invention section is provided only for better understanding of the background of the invention and should not be taken as an acknowledgment or any form of suggestion that this information forms a prior art that would already be known to a person skilled in the art.

RELATED ART DOCUMENT

Patent Document 1: Korean Patent No. 10-1000120 (Dec. 3, 2010)

BRIEF SUMMARY OF THE INVENTION

Various aspects of the present invention provide a light extraction substrate for an organic light-emitting device which can overcome disadvantage of a conventional photonic crystal pattern having a periodic structure that light extraction is limited to a specific wavelength range that occurs and can cause light extraction in a wider wavelength range by disposing a photonic crystal pattern having a non-periodic structure at the front side of an organic light-emitting diode portion through which light from the organic light-emitting diode portion is emitted, a method of fabricating the same and an organic light-emitting device including the same.

In an aspect of the present invention, provided is a light extraction substrate disposed on one surface of an organic light-emitting diode portion through which light from the organic light-emitting diode portion is emitted. The light extraction substrate includes: a base substrate; a matrix layer disposed between the organic light-emitting diode portion and the base substrate; and a photonic crystal pattern disposed on the base substrate and positioned inside the matrix layer, the photonic crystal pattern having a non-periodic structure. The matrix layer and the photonic crystal pattern form an internal light extraction layer of the organic light-emitting device.

According to an embodiment of the present invention, the photonic crystal pattern may be formed in a striped pattern on the base substrate.

The photonic crystal pattern may include a plurality of bars which are arranged in one direction on the base substrate. The widths of the plurality of bars, distances between the plurality of bars and pitches between the plurality of bars are non-periodic.

The thicknesses of the plurality of bars may be equal or different.

Each of the plurality of bars may have a non-periodic protrusion-depression pattern on the upper surface thereof.

The plurality of bars may include scattering particles which are dispersed inside the plurality of bars.

The photonic crystal pattern may have a multilayer structure which includes: a first photonic crystal pattern disposed on the base substrate; and a second photonic crystal pattern disposed on the first photonic crystal pattern. The first photonic crystal pattern and the second photonic crystal pattern are angled with respect to each other.

The second photonic crystal pattern may be angled at an angle ranging from 10 to 90° with respect to the first photonic crystal pattern.

The refractive index of the first photonic crystal pattern may be lower than the refractive index of the matrix layer, and the refractive index of the matrix layer may be lower than the refractive index of the second photonic crystal pattern.

In another aspect of the present invention, provided is a method of light extraction substrate which is disposed on one surface of an organic light-emitting diode portion through which light from the organic light-emitting diode portion is emitted. The method includes the following steps of: forming a photonic crystal pattern having a non-periodic structure on a base substrate by bar coating while controlling a rolling speed of a rolling bar for the bar coating; and forming a matrix layer such that a surface of the matrix layer adjoining the organic light-emitting diode portion forms a flat surface and the photonic crystal pattern is positioned inside the matrix layer.

According to an embodiment of the present invention, the step of forming the photonic crystal pattern may include forming a first photonic crystal pattern on the base substrate and forming a second photonic crystal pattern after rotating the base substrate such that the first and second photonic crystal patterns are arranged in different directions, whereby the photonic crystal pattern has a multilayer structure.

The base substrate may be rotated at an angle ranging from 10 to 90.

The first photonic crystal pattern, the second photonic crystal pattern and the matrix layer may be made of materials having different refractive indices. The refractive index of the first photonic crystal pattern is lowest among the different refractive indices, and the refractive index of the second photonic crystal pattern is highest among the different refractive indices.

The rolling bar may have a coil which is non-periodically wound on the outer circumference thereof.

The step of forming the photonic crystal pattern may include mixing scattering particles into a material that is to form the photonic crystal pattern before the bar coating.

In a further aspect of the present invention, provided is an organic light-emitting device that includes the above-mentioned light extraction substrate on one surface of an organic light-emitting diode portion through which light from the organic light-emitting diode portion is emitted.

According to embodiments of the present invention, the photonic crystal pattern having a non-periodic structure is disposed at the front side of an organic light-emitting diode portion through which light from the organic light-emitting diode portion is emitted. This consequently makes it possible to overcome disadvantage of a conventional photonic crystal pattern having a periodic structure that light extraction is limited to a specific wavelength range that occurs, i.e. a phenomenon in which light extraction significantly increases in a specific wavelength range. This also makes it possible to cause light extraction in a wider wavelength range. Accordingly, the light extraction substrate according to the present invention is applicable for a light extraction substrate for a white lighting organic light-emitting device.

In addition, in case the photonic crystal pattern having a non-periodic structure is made of a material that includes light-scattering particles, light extraction efficiency can be further improved.

Furthermore, since the relatively-inexpensive bar coating process can be used to form the photonic crystal pattern having a non-periodic pattern, it is possible to reduce the cost of the process for fabricating a light extraction substrate.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
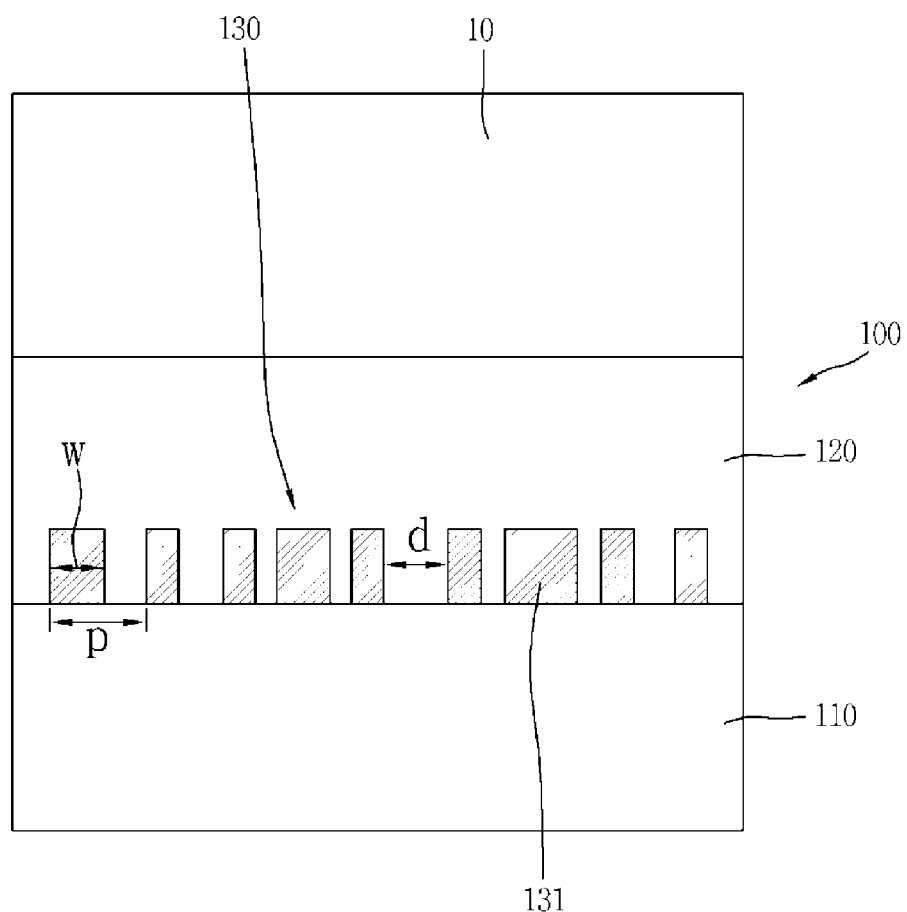
FIG. 1 is a front cross-sectional view schematically showing an organic light-emitting device which has a light extraction substrate according to one exemplary embodiment of the present invention as an internal light extraction substrate of an organic light-emitting device.

Reference will now be made in detail to a light extraction substrate for an organic light-emitting device, a method of fabricating the same and an organic light-emitting device including the same according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, the organic light-emitting device according to this exemplary embodiment includes the organic light-emitting diode portion 10 and the light extraction substrate 100 which is disposed on one surface of the organic light-emitting diode portion 10 through which light from the organic light-emitting diode portion 10 is emitted in order to improve the light extraction efficiency of the organic light-emitting device.

Although not shown, the organic light-emitting diode portion has a multilayer structure in which an anode, an organic light-emitting layer and a cathode are sandwiched between the light extraction substrate 100 and a substrate that faces the light extraction substrate 100. Here, the anode can be made of a metal or metal oxide, for example, Au, In, Sn or indium tin oxide (ITO), which has a significant work function in order to facilitate the hole injection. The cathode can be made of a metal thin film of, for example, Al, Al:Li or Mg:Ag, which has a smaller work function in order to facilitate the electron injection. When the organic light-emitting device is a top emission type, the cathode can have a multilayer structure that includes a semitransparent electrode of a metal thin film made of Al, Al:Li or Mg:Ag and a transparent electrode of an oxide thin film made of, for example, ITO, in order to facilitate the transmission of light that is generated from the organic light-emitting layer. The organic light-emitting layer includes a hole injection layer, a hole transport layer, an emissive layer, an electron transport layer and an electron injection layer which are sequentially stacked on the anode. In case the organic light-emitting device according to this exemplary embodiment is implemented as a white lighting organic light-emitting device, for example, the light-emitting layer can have a multilayer structure that includes a high-molecular light-emitting layer which emits blue light and a low-molecular light-emitting layer which emits orange-red light. The light-emitting layer can also have a variety of other structures to emit white light.

With this structure, when a forward voltage is induced between the anode and the cathode, electrons from the cathode migrate to the emissive layer through the electron injection layer and the electron transport layer, and holes from the anode migrate to the emissive layer through the hole injection layer and the hole transport layer. The electrons and holes that have migrated into the emissive layer recombine with each other, thereby generating excitons. When these excitons transit from an excited state to a ground state, light is emitted. The brightness of the light emitted is proportional to the amount of current that flows between the anode and the cathode.

The light extraction substrate 100 for an organic light-emitting device according to this exemplary embodiment includes a base substrate 110, a matrix layer 120 and a photonic crystal pattern 130.

The base substrate 110 is the substrate that supports the matrix layer 120 and the photonic crystal pattern 130 which are disposed on one surface thereof. In addition, the base substrate 110 is disposed at the front side of the organic light-emitting diode portion 10 through which light from the organic light-emitting diode portion 10 is emitted, and serves as an encapsulation substrate that allows the light to exit through while protecting the organic light-emitting diode portion 10 from the external environment.

The base substrate 110 may be any transparent substrate that has superior light transmittance and mechanical properties. For instance, the base substrate 110 can be made of a polymeric material, such as a thermally or ultraviolet (UV) curable organic film, or a chemically strengthened glass, such as soda-lime glass ($SiO_2$—$CaO$—$Na_2O$) or alumino-silicate glass ($SiO_2$—$Al_2O_3$—$Na_2O$). When the organic light-emitting device including the organic light-emitting diode portion 10 and the light extraction substrate 100 according to this exemplary embodiment is applied for lighting, the base substrate 110 can be made of soda-lime glass. According to this exemplary embodiment, the base substrate 110 can be made of a piece of thin glass having a thickness of 1.5 mm or less. The thin glass can be made using a fusion process or a floating process. Alternatively, the base substrate 110 may be a substrate that is made of a metal oxide or a metal nitride.

According to this exemplary embodiment, the matrix layer 120 and the photonic crystal pattern 130 form an internal light extraction layer of the organic light-emitting device. One surface of the matrix layer 120 adjoins the base substrate 110, and the other surface of the matrix layer 120 adjoins the organic light-emitting diode portion 10, more particularly, the anode of the organic light-emitting diode portion 10. Thus, the matrix layer 120 is disposed between the organic light-emitting diode portion 10 and the base substrate 110. As the other surface of the matrix layer 120 adjoins the organic light-emitting diode portion 10, the surface of the matrix layer 120 must have a high level of flatness in order to prevent the electrical characteristics of the organic light-emitting diode portion 10 from being deteriorated. According to this exemplary embodiment, the photonic crystal pattern 130 is positioned inside the matrix layer 120. The matrix layer 120 serves as a planarization layer that covers the photonic crystal pattern 130. The matrix layer 120 is made of a material, the refractive index of which differs from that of the photonic crystal pattern 130 which is positioned inside the matrix layer 120. The matrix layer 120 can be made of a metal oxide or a metal nitride. For example, the matrix layer 120 can be made of a metal oxide, such as $TiO_2$, $SnO_2$, $Al_2O_3$ or $ZnO$, or a metal nitride, such as $SiN_x$. According to this exemplary embodiment, the thickness of the matrix layer 120 may be about 1 μm.

The photonic crystal pattern 130 which forms, together with the matrix layer 120, the internal light extraction layer of the organic light-emitting device is disposed on the base substrate 110. The photonic crystal pattern 130 is positioned inside the matrix layer 120. The photonic crystal pattern 130 serves to diversify paths along which light from the organic light-emitting diode portion 10 is emitted, thereby improving the light extraction efficiency of the organic light-emitting device.

Figure 2:
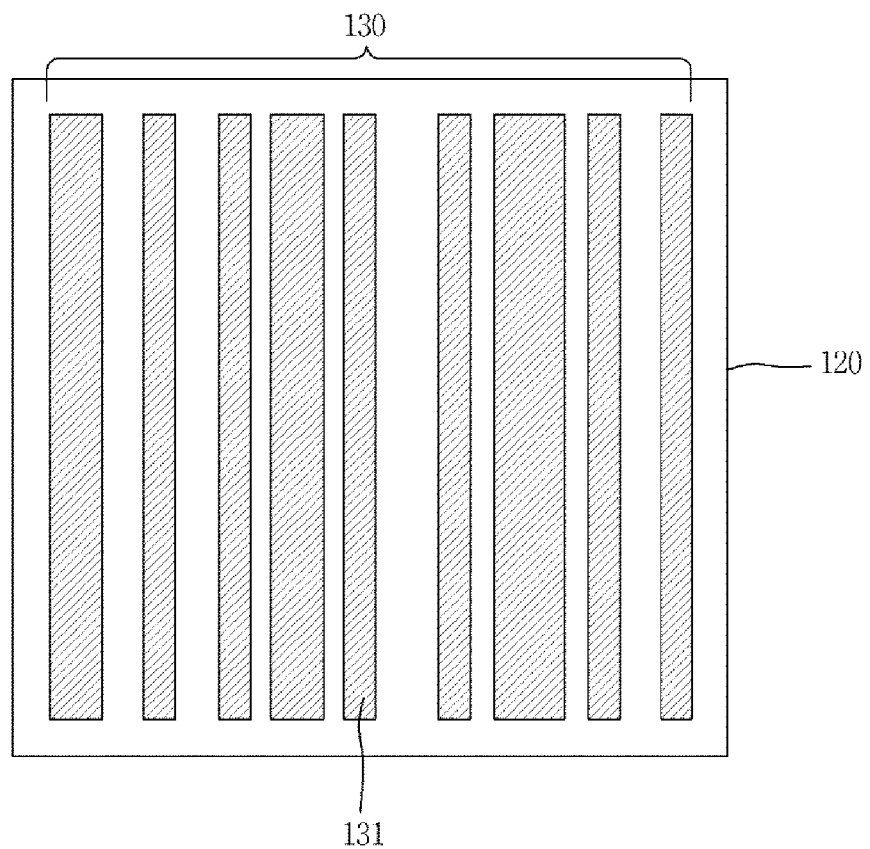
FIG. 2 is a top-plan view showing the light extraction substrate for an organic light-emitting device according to another exemplary embodiment of the present invention.

When the organic light-emitting device according to this exemplary embodiment is a white lighting organic light-emitting device, light extraction must be caused in a wide wavelength range. For this, the photonic crystal pattern 130 according to this exemplary embodiment has a non-periodic structure in order to prevent light extraction from rapidly increasing within a specific wavelength range as in a conventional photonic crystal pattern having a periodic structure. Specifically, as shown in FIG. 1 and FIG. 2, the photonic crystal pattern 130 may be formed in a striped pattern in which a plurality of bars 131 are arranged in one direction on the base substrate 110. The widths w of the plurality of bars 131, the distances d between the plurality of bars 131 and the pitches p of the plurality of bars 131 are non-periodic or random, and the photonic crystal pattern 130 has a non-periodic structure. For instance, the widths w of the bars 131 can vary within the range from 1 to 3 μm, and the distances between the bars 131 can vary within the range from 10 nm to 1 μm. In addition, the height of the bars 131 can range from 250 to 500 nm. Furthermore, the widths of the plurality of the bars 131 can be random, i.e. be equal or different.

As such, when the photonic crystal pattern 130 having a non-periodic structure is disposed at the front side through which light from the organic light-emitting diode portion 10 is emitted, light extraction is uniformly caused within a wide wavelength range suitable to the lighting organic light-emitting device. The photonic crystal pattern 130 can be formed by bar coating, which will be described in greater detail later.

Figure 3:
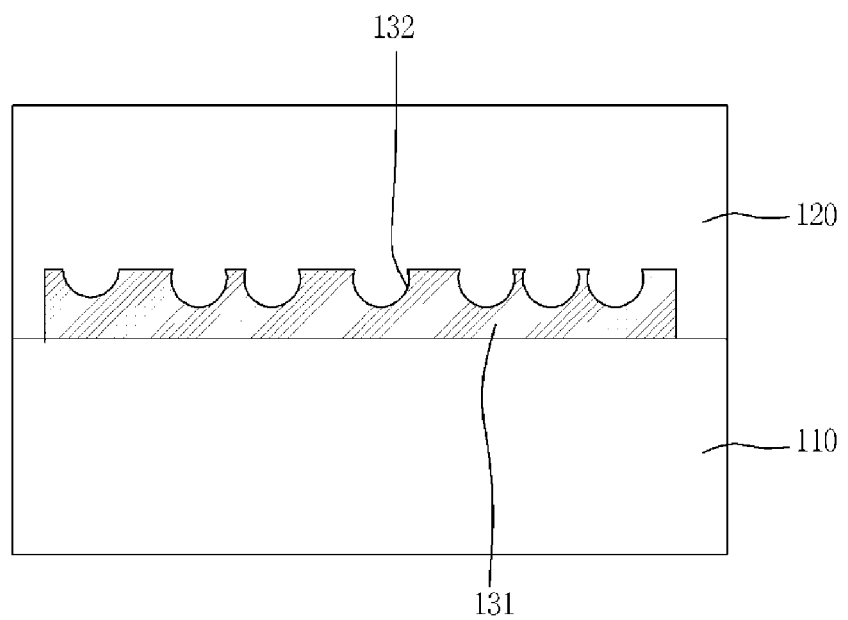
FIG. 3 is a side cross-sectional view showing the light extraction substrate for an organic light-emitting device according to another exemplary embodiment of the present invention.

As shown in FIG. 3, a non-periodic protrusion-depression pattern 132 can be formed on the upper surface of each of the bars 131 of the photonic crystal pattern 130 (when referring to FIG. 3). When the non-periodic protrusion-depression pattern 132 is formed on the upper surface of the bars 131 which have the non-periodic widths and the non-periodic arrangement, the paths along which light from the organic light-emitting diode portion is emitted can be further diversified, thereby further improving the light extraction efficiency. In addition, although not shown, scattering particles that scatter light can be dispersed inside the bars 131. The diameter of the scattering particles can be about 100 nm. The scattering particles can be made of a material, the refractive index of which differs from that of the bars 131 or the matrix layer 120.

The protrusion-depression pattern 132 and the scattering particles as described above can increase the light extraction efficiency of the organic light-emitting device.

A description will be given below of a light extraction substrate for an organic light-emitting device according to another exemplary embodiment of the present invention with reference to FIG. 4 to FIG. 6.

Figure 4:
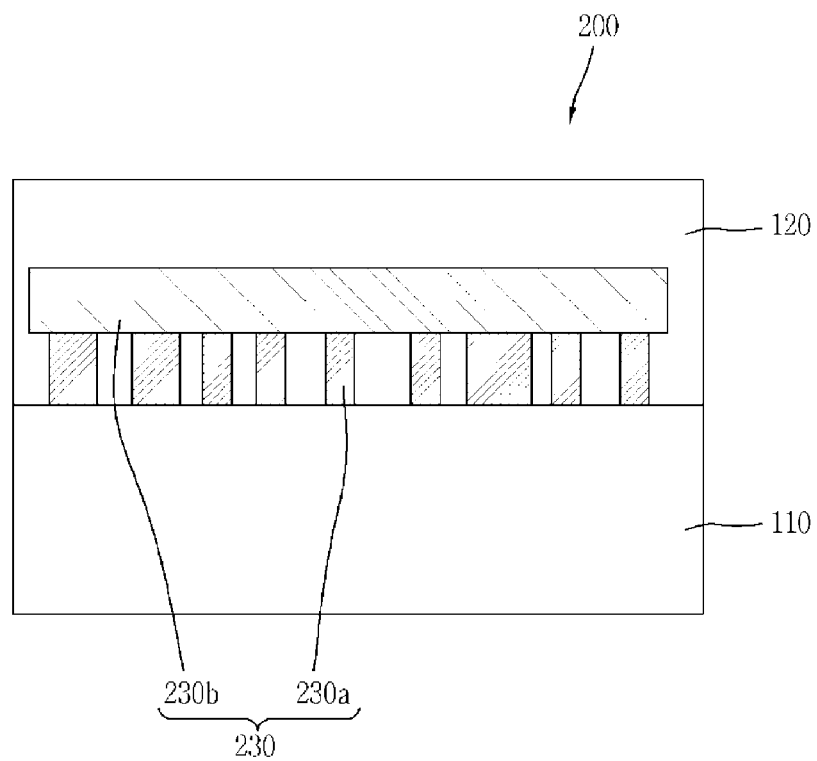
FIG. 4 is a front cross-sectional view showing a light extraction substrate for an organic light-emitting device according to another exemplary embodiment of the present invention.
Figure 5:
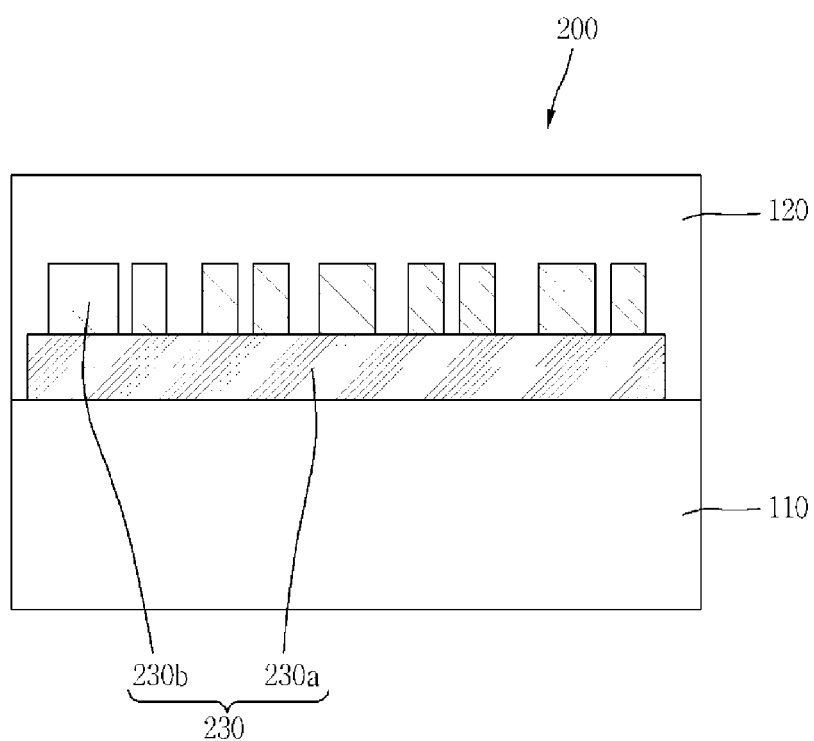
FIG. 5 is a side cross-sectional view showing the light extraction substrate shown in FIG. 4.
Figure 6:
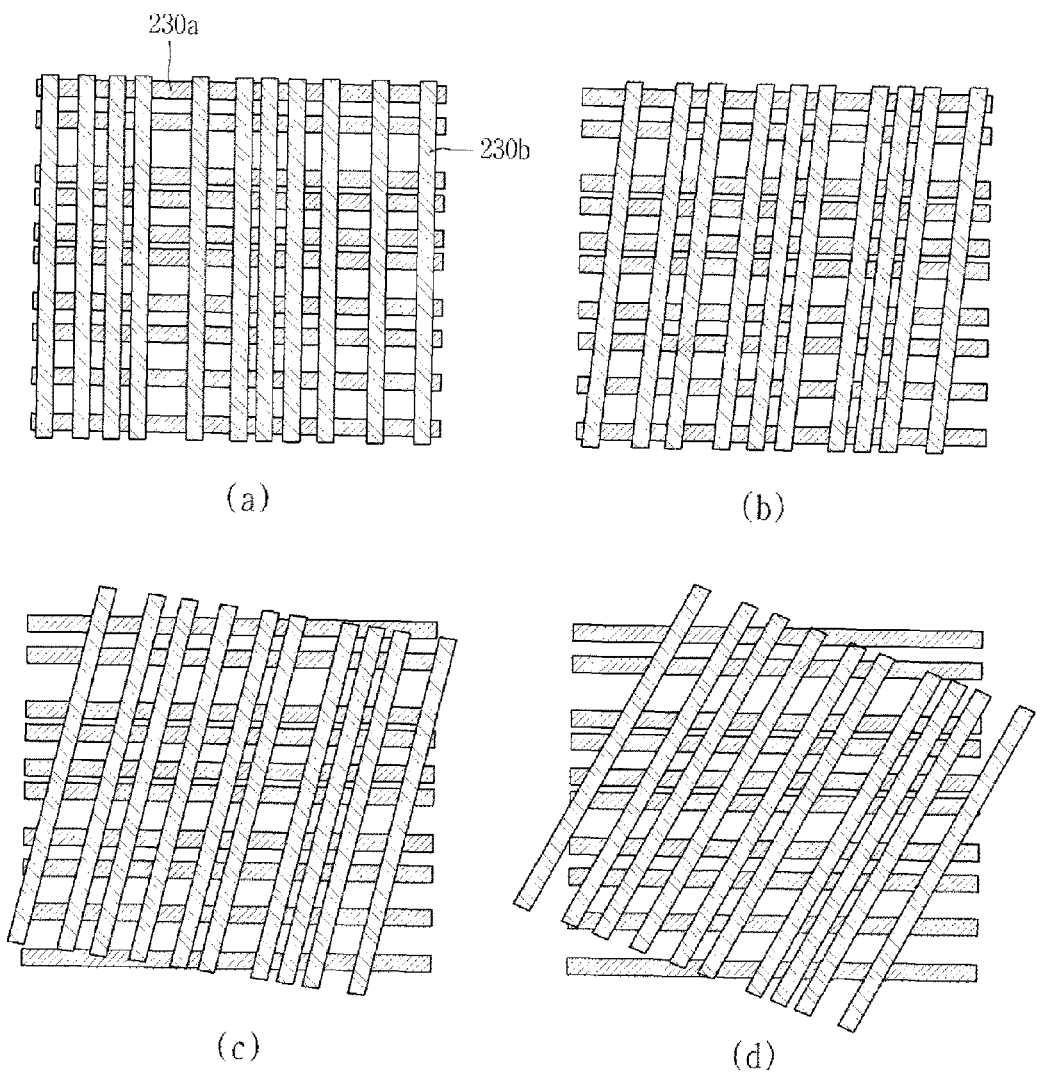
FIG. 6 is top-plan views showing the light extraction substrate for an organic light-emitting device according to other exemplary embodiments of the present invention.
Figure 7:
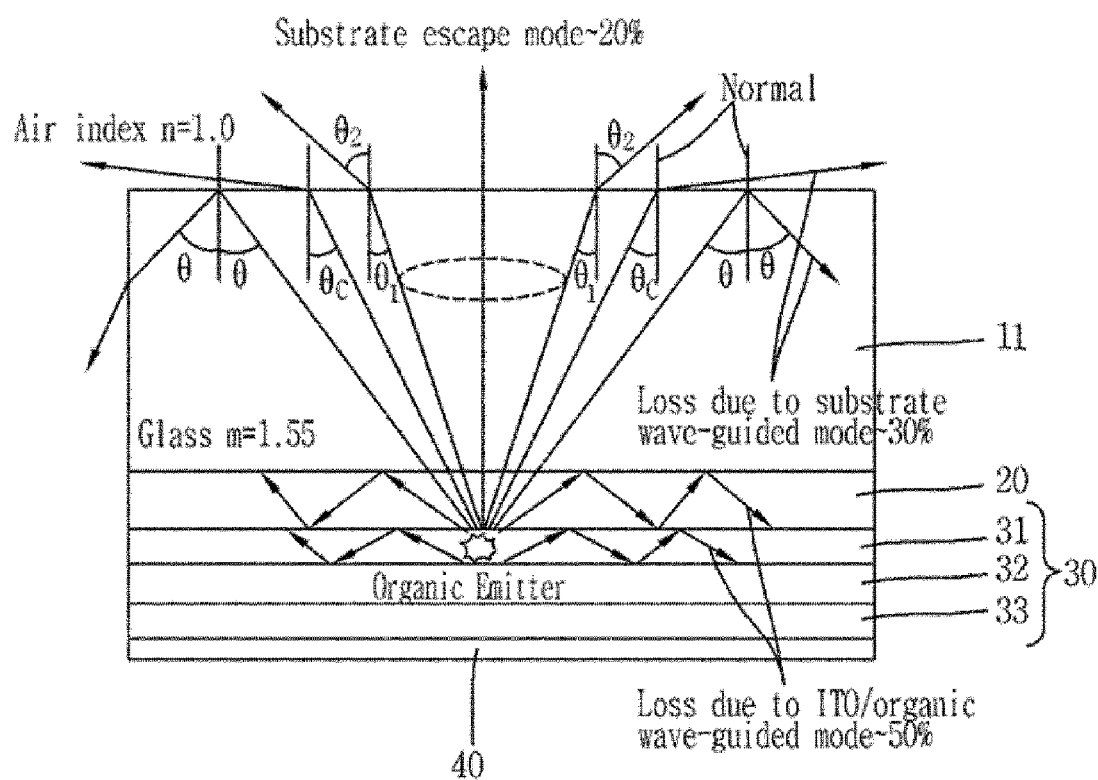
FIG. 7 is a conceptual view depicting the cross-section of a conventional organic light-emitting diode portion and the light extraction efficiency thereof.

FIG. 4 is a front cross-sectional view showing the light extraction substrate for an organic light-emitting device according to another exemplary embodiment of the present invention, FIG. 5 is a side cross-sectional view showing the light extraction substrate shown in FIG. 4, and FIG. 6 shows top-plan views of light extraction substrates for an organic light-emitting devices according to other exemplary embodiments of the present invention.

As shown in FIG. 4 and FIG. 5, the light extraction substrate 200 for an organic light-emitting device according to this exemplary embodiment includes a base substrate 110, a matrix layer 120 and a photonic crystal pattern 230.

Since this exemplary embodiment of the present invention is substantially the same as the former exemplary embodiments of the present invention, except for the structure of the photonic crystal pattern, the same reference numerals will be used to designate the same components and detailed descriptions thereof will be omitted.

The photonic crystal pattern 230 according to this exemplary embodiment includes a first photonic crystal pattern 230a and a second photonic crystal pattern 230b which are stacked on each other to form a multilayer structure. The first photonic crystal pattern 230a is disposed on the base substrate 110. The first photonic crystal pattern 230a can have the same non-periodic structure as the photonic crystal pattern 130 according to the former exemplary embodiments. The second photonic crystal pattern 230b is disposed on the first photonic crystal pattern 230a. A coating solution to form the second photonic crystal pattern can fill the spaces between the bars of the first photonic crystal pattern, depending on the viscosity of the coating solution. Like the first photonic crystal pattern 230a, the second photonic crystal pattern 230b can have a non-periodic structure.

According to this exemplary embodiment, the refractive index of the first photonic crystal pattern 230a can be lower than the refractive index of the matrix layer 120, and the refractive index of the matrix layer 120 can be lower than the refractive index of the second photonic crystal pattern 230b. For instance, the first photonic crystal pattern 230a can be made of a material having a refractive index of 1.5, the matrix layer 120 can be made of a material having a refractive index of 1.8, and the second photonic crystal pattern 230b can be made of a material having a refractive index of 2.4. As in the former exemplary embodiments, scattering particles can be dispersed inside the first photonic crystal pattern 230a and the second photonic crystal pattern 230b. In this case, the refractive index of the scattering particles dispersed inside the first photonic crystal pattern 230a can differ from that of the scattering particles dispersed inside the second photonic crystal pattern 230b. For instance, the scattering particles dispersed inside the first photonic crystal pattern 230a can be made of a material having a refractive index, for example, of 2.4, which is higher than the refractive index of the first photonic crystal pattern 230a. In addition, the scattering particles dispersed inside the second photonic crystal pattern 230b can be made of a material having a refractive index, for example, of 1.5, which is lower than the refractive index of the second photonic crystal pattern 230b.

The second photonic crystal pattern 230b can be formed such that it is angled with respect to the direction in which the first photonic crystal pattern 230a is arranged. As shown in FIG. 6, the second photonic crystal pattern 230b can be angled at a variety of angles ranging from 10 to 90° with respect to the direction in which the first photonic crystal pattern 230a is arranged.

In the light extraction substrate 200 for an organic light-emitting device according to this exemplary embodiment as set forth above, the first and second photonic crystal patterns 230a and 230b each having a non-periodic structure form a multilayer structure which complicates or diversifies paths along which light is scattered or emitted. Consequently, the organic light-emitting device employing the light extraction substrate 200 can cause more improved light extraction in a wider wavelength range.

A description will be given below of a method of fabricating a light extraction substrate for an organic light-emitting device according to an exemplary embodiment of the present invention. Reference numerals for the components of the light extraction substrate will refer to those in FIG. 1 to FIG. 6.

The method of fabricating a light extraction substrate for an organic light-emitting device according to this exemplary embodiment is the method of fabricating the light extraction substrate 100 or 200 disposed on one surface of the organic light-emitting diode portion 10 through which light from the organic light-emitting diode portion 10 is emitted. The method includes a photonic crystal patterning step and a matrix layer forming step.

The photonic crystal patterning step is the step of forming the photonic crystal pattern 130 having a non-periodic structure on the base substrate 110. The photonic crystal patterning step forms the photonic crystal pattern 130 by bar coating. The photonic crystal pattern 130 having a non-periodic structure is formed by controlling the rolling speed of a rolling bar (not shown) during the bar coating. Specifically, at the photonic crystal patterning step, the rolling speed of the rolling bar (not shown) is non-periodically increased and reduced. Consequently, the plurality of bars 131 of the photonic crystal pattern 130 are formed on the base substrate 110 in the areas in which the rolling speed is reduced. It is possible to control the widths w and the coating thicknesses of the bars 131 by controlling the time period for which the reduced rolling speed is maintained after reducing the rolling speed. When the rolling speed is increased, the rolling bar (not shown) moving over the base substrate 110 does not form the bars 131. It is possible to control the widths of non-coating areas where the bars 131 are not formed, i.e. the distances d between the adjacent bars 131 and the pitches p of the adjacent bars 131, by controlling the time period for which the increased rolling speed is maintained after increasing the rolling speed. When the rolling speed is increased and reduced in this non-periodic manner, the photonic crystal pattern 130, of which the widths w, distances d and pitches p are non-periodic and the coating thicknesses are random, is formed on the base substrate 110.

According to this exemplary embodiment, the photonic crystal pattern 230 can have a multilayer structure as in the light extraction substrate 200. For this purpose, the photonic crystal patterning step carries out forming the first photonic crystal pattern 230a on the base substrate 110 by bar coating, rotating the base substrate 110 at an angle, for example, ranging from 10 to 90°, and then forming the second photonic crystal pattern 230b on the first photonic crystal pattern 230a by bar coating, thereby forming the photonic crystal pattern 230 having a multilayer structure in which the first photonic crystal pattern 230a and the second photonic crystal pattern 230b are arranged in different directions.

In addition, at the photonic crystal patterning step, the first photonic crystal pattern 230a and the second photonic crystal pattern 230b can be made of materials having different refractive indices. The first photonic crystal pattern 230a can be made of a lower refractive index material.

During the bar coating, the photonic crystal patterning step can use a rolling bar (not shown) with coils being non-periodically wound on the outer circumference thereof. When the photonic crystal pattern 130 or 230 is formed using the rolling bar (not shown) as described above, the non-periodic protrusion-depression pattern 132 which diversifies optical paths is formed on the surface of the photonic crystal pattern 130 or 230.

In addition, the photonic crystal patterning step can include mixing light-scattering particles into the materials that is to form the photonic crystal pattern 130 or 230 in order to distribute the scattering particles inside the photonic crystal pattern 130 or 230.

Afterwards, the matrix layer forming step is the step of forming the matrix layer 120 which forms, together with the photonic crystal pattern 130 or 230, an internal light extraction layer of the organic light-emitting device. The matrix layer forming step forms the matrix layer 120 into a shape that covers the photonic crystal pattern 130 or 230 such that the photonic crystal pattern 130 or 230 is disposed inside the matrix layer 120. Since the surface of the matrix layer 120 that adjoins the organic light-emitting diode portion 10 must be flat, the matrix layer 120 is preferably formed as a thick film in order to conceal the shape of the inside photonic crystal pattern 130 or 230. For instance, when the thickness of the photonic crystal pattern 130 or 230 ranges from 250 to 500 nm, the thickness of the matrix layer 120 can be 1 µm.

When the matrix layer forming step as described above is completed, the light extraction substrate 100 or 200 for an organic light-emitting device according to the present invention is obtained.

As set forth above, the method of fabricating a light extraction substrate for an organic light-emitting device according to this exemplary embodiment employs the relatively-inexpensive bar coating process to form the photonic crystal pattern 130 or 230 having a non-periodic pattern. In conventional nano-lithographic imprinting which forms a random pattern, there are problems in that it is difficult to machine a primary mold having a nano-level size and a large amount of time and cost is consumed. In contrast, according to the present invention that employs the bar coating, it is possible to easily form the photonic crystal pattern 130 or 230 having a non-periodic structure, thereby significantly reducing the cost of the process for fabricating a light extraction substrate compared to conventional technologies.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of fabricating a light extraction substrate for an organic light-emitting device, the method comprising:
   forming a photonic crystal pattern having a non-periodic structure on a base substrate by bar coating while controlling a rolling speed of a rolling bar for the bar coating; and
   forming a matrix layer such that a surface of the matrix layer adjoining an organic light-emitting diode portion of an organic light-emitting device forms a flat surface and the photonic crystal pattern is positioned inside the matrix layer,
   wherein the light extraction substrate is disposed on one surface of the organic light-emitting diode portion through which light from the organic light-emitting diode portion is emitted.

2. The method according to claim 1, wherein forming the photonic crystal pattern comprises
   forming a first photonic crystal pattern on the base substrate and forming a second photonic crystal pattern after rotating the base substrate such that the first and second photonic crystal patterns are arranged in different directions, whereby the photonic crystal pattern has a multilayer structure.

3. The method according to claim 2, wherein the base substrate is rotated at an angle ranging from 10° to 90°.

4. The method according to claim 2, wherein the first photonic crystal pattern, the second photonic crystal pattern and the matrix layer are formed from materials having different refractive indices, a refractive index of the first photonic crystal pattern being lowest among the different refractive indices, and a refractive index of the second photonic crystal pattern being highest among the different refractive indices.

5. The method according to claim 1, wherein the rolling bar has a coil which is non-periodically wound on an outer circumference thereof.

6. The method according to claim 1, wherein forming the photonic crystal pattern comprises mixing scattering particles into a material that is to form the photonic crystal pattern before the bar coating.

7. The method according to claim 5, wherein the photonic crystal pattern has a non-periodic protrusion-depression pattern on an upper surface thereof.

8. The method according to claim 1, wherein the photonic crystal pattern is formed in a striped pattern on the base substrate.

9. The method according to claim 7, wherein the photonic crystal pattern comprises a plurality of bars which are arranged in one direction on the base substrate, wherein widths of the plurality of bars, distances between the plurality of bars and pitches of the plurality of bars are non-periodic.

10. The method according to claim 8, wherein thicknesses of the plurality of bars are equal or different.

\* \* \* \* \*